US010725085B2

United States Patent
Dzienis et al.

(10) Patent No.: US 10,725,085 B2
(45) Date of Patent: Jul. 28, 2020

(54) METHOD, DEVICE AND SYSTEM FOR DETERMINING THE FAULT POSITION OF A FAULT ON A LINE OF AN ELECTRICAL POWER SUPPLY NETWORK

(71) Applicant: SIEMENS AKTIENGESELLSCHAFT, Munich (DE)

(72) Inventors: Cezary Dzienis, Dallgow-Doeberitz (DE); Andreas Jurisch, Schwante (DE)

(73) Assignee: Siemens Aktiengesellschaft, Munich (DE)

(*) Notice: Subject to any disclaimer, the term of this patent is extended or adjusted under 35 U.S.C. 154(b) by 308 days.

(21) Appl. No.: 15/928,298

(22) Filed: Mar. 22, 2018

(65) Prior Publication Data

US 2018/0275188 A1  Sep. 27, 2018

(30) Foreign Application Priority Data

Mar. 22, 2017 (EP) .................................. 17162355

(51) Int. Cl.
*G01R 31/08* (2020.01)

(52) U.S. Cl.
CPC ......... *G01R 31/086* (2013.01); *G01R 31/085* (2013.01); *G01R 31/088* (2013.01)

(58) Field of Classification Search
CPC .... G01R 31/08; G01R 31/083; G01R 31/085; G01R 31/086; G01R 31/088; G01R 31/50; G01R 31/52
USPC .............................. 324/522, 535; 702/58, 59
See application file for complete search history.

(56) References Cited

U.S. PATENT DOCUMENTS

| 3,590,368 | A | 6/1971 | Esclangon |
| 4,183,072 | A | 1/1980 | Takagi et al. |
| 4,996,624 | A | 2/1991 | Schweitzer, III |
| 5,202,812 | A | 4/1993 | Shinoda et al. |
| 5,929,642 | A | 7/1999 | Philippot et al. |
| 7,755,371 | B2* | 7/2010 | Wells ............. G01R 27/16 324/522 |

(Continued)

FOREIGN PATENT DOCUMENTS

| CH | 684660 A5 | 11/1994 |
| EP | 2476002 B1 | 5/2015 |

(Continued)

*Primary Examiner* — Steven L Yeninas
(74) *Attorney, Agent, or Firm* — Laurence Greenberg; Werner Stemer; Ralph Locher (57) ABSTRACT

A method determines a fault position of a fault on an electrical line. First time stamped current and voltage values are measured at a first line end. Second time stamped current and voltage values are measured at a second line end. The fault position of the line is determined from these measured values. To carry out positioning of a data window for fault location according to the traveling wave principle, after the first current and voltage values are measured at the first line end, the second current and voltage values are determined, which indicate the current or voltage at the second line end. Estimated second current or voltage values are compared with the values measured at the second line end, and the first and second current and voltage values that lie within a period of time established by a first data window are employed to determine a first fault position.

16 Claims, 8 Drawing Sheets

(56) References Cited

U.S. PATENT DOCUMENTS

| | | | |
|---|---|---|---|
| 9,007,733 B2* | 4/2015 | Wang | G01R 31/085 |
| | | | 361/62 |
| 9,316,671 B2* | 4/2016 | Johannesson | G01R 31/085 |
| 9,478,968 B2 | 10/2016 | Blumschein et al. | |
| 10,324,132 B2 | 6/2019 | Saarinen et al. | |
| 2006/0012374 A1 | 1/2006 | Kojovic et al. | |
| 2011/0109465 A1 | 5/2011 | Jurisch | |
| 2013/0107405 A1* | 5/2013 | Blumschein | H02H 7/26 |
| | | | 361/79 |
| 2014/0074414 A1 | 3/2014 | Schweitzer, III et al. | |
| 2015/0081235 A1 | 3/2015 | Schweitzer, III et al. | |
| 2015/0081236 A1 | 3/2015 | Schweitzer, III et al. | |
| 2017/0117701 A1* | 4/2017 | Johannesson | H02H 3/305 |

FOREIGN PATENT DOCUMENTS

| | | |
|---|---|---|
| WO | 2011156400 A1 | 12/2011 |
| WO | 2012126526 A1 | 9/2012 |

\* cited by examiner

METHOD, DEVICE AND SYSTEM FOR DETERMINING THE FAULT POSITION OF A FAULT ON A LINE OF AN ELECTRICAL POWER SUPPLY NETWORK

CROSS-REFERENCE TO RELATED APPLICATION

This application claims the benefit, under 35 U.S.C. § 119, of European patent application EP 17162355.6, filed Mar. 22, 2017; the prior application is herewith incorporated by reference in its entirety.

BACKGROUND OF THE INVENTION

Field of the Invention

The invention relates to a method for determining the fault position of a fault on a line of an electrical power supply network, in which first current and voltage values are measured at a first line end of the line and provided with a time stamp and second current and voltage values are measured at a second line end of the line and provided with a time stamp, and—by using the time-stamped first and second current and voltage values after the occurrence of a fault on the line, the fault position of the latter is determined.

The invention also relates to a corresponding device and to a system for determining the fault position of a fault on a+ line of an electrical power supply network.

The safe operation of electrical power supply networks requires rapid and reliable identification and shutdown of any faults, for example short circuits or ground faults. Fault causes which lead to a shutdown may for example be lightning strikes, torn or otherwise damaged lines defective insulations on cable lines or accidental touching of overhead lines with parts of animals or plants. In order to shorten downtimes due to faults, such faults must be localized as accurately as possible, in order to make it possible for a maintenance team to remedy the fault causes and any consequential damage caused by the fault.

In the simplest, but also most expensive case, fault location is carried out by visual inspection. In this case, the maintenance team travels along the defective line and examines it for visible fault positions. This procedure is slow and prone to error.

For this reason, there is a substantial change over to narrowing down the fault position, at which the fault is situated on the line, by an analysis of measurement quantities, for example currents and voltages, when the fault occurs. A plurality of different methods are so far known for this, the accuracy of which has a significant impact on the maintenance cost of the power supply network. Great value is therefore placed on improving the accuracy of the algorithms used for the location in order to facilitate the maintenance and, in particular, to shorten downtimes of the power supply network due to faults.

An approximate result of the fault location may, for example, be achieved by publishing fault direction. This method is predominantly used in resonant-neutral grounded, isolated-neutral and high-resistance grounded power supply networks with a radial structure, or a low degree of meshing. In this case, for example, a wattmetric method such as is known from European patent EP 2476002 B1 may be used. Another method for detecting the fault direction is the so-called "interval time-delay relay" which is disclosed in one possible embodiment for example by the international patent disclosure WO 2012126526 A1. For more accurate location with these methods, however, additional evaluation is necessary.

Methods for more accurate fault location use, for example, the measured current/voltage signals of the fundamental wave (50 Hz or 60 Hz signals) for the fault location. In this case, methods are known in which use measurement values of only one of the line ends (single-ended fault location) or measurement values of both line ends (two-ended fault location). As a result, the fault position is generally indicated as a distance from the respective measurement site (as a percentage of the line or in km or miles).

In the case of using measurement values of only one line end, the outlay for carrying out the fault location is low. This fault location method is predominantly an impedance-based method, in which impedance up to the fault position is calculated from the current and measurement values. By comparison with the line impedance of the overall line in the fault-free case, it is possible to draw a conclusion about the fault position. One exemplary embodiment of such a fault location method may, for example, be found in U.S. Pat. No. 4,996,624.

The accuracy of this method depends, inter alia, strong on the measurement accuracy of the current and voltage transformers used, the accuracy of the line parameters (for example impedance per unit length) used for the fault location as well as on the existing fault conditions (for example fault resistance, load) and network condition. Perturbations and the transient processes in the current and voltage signals may have a negative effect on the accuracy of this method. The measurement errors thereby incurred may amount to several percent.

An improved accuracy in the fault location may be achieved by the use of measurement values of both line ends. In this case, the fault location-related measurement values need to be combined by a suitable communication connection. In this context, references made to the U.S. Pat. No. 5,929,642; in the method described therein, a very high accuracy (measurement error about 1-2%) in the fault location is achieved by using current and voltage measurement values of both line ends with the aid of estimation methods and nonlinear optimization methods.

While the accuracy of the fault location in the impedance-based fault location methods depends on the measurement accuracy of the measuring transformers and the network condition, by using a fault location method according to the so-called traveling wave ("traveling wave fault location"), a substantial independency from these quantities can be achieved. According to this principle, instead of the fundamental wave of the measured current and voltage signals, the transient signal components occurring in the case of a fault, which arise in the form of so-called "traveling waves", are taken into account for the fault location. In this case, the high-frequency traveling wave edges are recorded by measurement and provided with a timestamp. Since the propagation speed of the traveling waves is approximately the speed of light, the location of the fault can be carried out well from evaluation of the time stamping. With this fault location method, accuracies in the range of a few dozen meters can be achieved.

One example of a fault location method of the type mentioned in the introduction may be found in U.S. patent publication No. 2006/0012374 A1.

One difficulty Ian fault location according to the traveling wave principle consists in positioning the data window used for the evaluation of the measurement values, i.e. the selection of a suitable chronological series of measurement values, with the aid of which determination of the fault position can be carried out. Thus, in the case of one-sided fault location according to the traveling wave principle, the data window used for the fault location must be placed exactly in the time range in which there is actually a fault on the line. Incorrect window positioning is one of the essential sources of error which may lead to inaccurate or incorrect fault location.

For positioning the data window, it is previously known for example to use the measured signals of the fundamental wave, i.e. for example the 50 Hz or 60 Hz signals. In this case, the positioning of the data window is formed as a function of an excitation signal of a protective function. This may, for example, involve the exceeding of a current threshold value, which is established by an overcurrent protective function. Since, however, protective functions are occasionally set too sensitively or too insensitively, data window positioning on the basis of the excitation signals may sometimes be associated with inaccuracies.

In order to reduce the inaccuracies, further algorithms may be used, although these also fail to clearly in the case of further fault development (for example consequential faults, fault extension).

Since protective functions furthermore operate with measurement values that have been recorded with relatively low sampling rate, the start of the excitation identified by a protective function possibly only lie significantly after the actual time of the fault occurrence, so that a data window positioned on the basis of this would possibly miss the fault occurrence phase essential for the evaluation of traveling waves. This is because, for example, typical sampling rates for protective functions which evaluate the fundamental wave of the measurement signal are a few kilohertz, for example between 1 kHz and 16 kHz, while the sampling rates used in connection with traveling waves are much higher, for example about 1 to 10 MHz. The start of a data window, as identified by means of the excitation of the protective function, is therefore typically delayed by 7 to 20 ms relative to the actual fault occurrence. Since the time range relevant to the evaluation of traveling waves lies between 0.1 and 10 ms after the fault occurrence, in the worst case the relevant time range may lie completely outside the data window used when positioning the data window with the aid of the protective function excitation.

It is known from U.S. patent publication No. 2006/0012374 A1 to deduce an existing fault with the aid of current variations in the signal of the fundamental wave, and to position the data window for the evaluation of traveling waves on this basis.

SUMMARY OF THE INVENTION

On the basis of this, it is an object of the present invention to carry out the positioning of a data window for fault location according to the traveling wave simple as exactly as possible, and therefore to improve the accuracy in the fault location.

This object is achieved according to the invention by a method of the type mentioned in the introduction, in which, with the first current and voltage values measured at the first line end, second current and voltage values are determined, which indicate the current flowing at the second line end or the voltage applied at the second line end. The estimated second current or voltage values are compared with the current or voltage values measured at the second line end, and first and second current and voltage values that lie within a period of time established by a first data window are employed in order to determine a first fault position. The start of the first data window is established as a function of the time at which a discrepancy is identified between the estimated second current or voltage values and the measured second current or voltage values.

In the method according to the invention, the data window is therefore positioned in that time range in the time profile of the current and voltage values in which a fault is identified on the line. The identification of the fault is carried out when a discrepancy is identified between the second voltage or current values identified at the other line end with the aid of the measurements at the first line end, and the voltage or current values actually measured at the other line end. In the state affected by a fault, these do not match, so that the start of the data window can be established by identifying the existence of a fault. Since the measurement signals employed for identifying the fault can be sampled with a high sampling rate suitable for traveling wave evaluation, the establishment of the start of the data window can also be carried out with very high accuracy. Because, instead of employing excitation signals of the protective functions (for example, the current exceeds a threshold value) to positioning the data window, as has previously been conventional, in the present case the estimated current or voltage values at the second line end are determined from the current or voltage values of the first line end, which are recorded for the fault location according to the traveling wave principle. The period of time in which the estimated second current/voltage values differ from those measured corresponds to the period of time in which the line is affected by a fault. By this accurate identification of the period of time of the fault on the line, very exact positioning of the data window employed for the evaluation can be carried out, by establishing the start of the data window as a function of the time at which a discrepancy has been identified between the estimated and measured values. In this case, the start of the data window can be established exactly. It may, however, also be established somewhat earlier, in order to achieve a certain safety margin in the recording of the traveling wave phenomena caused by the fault.

The time is used for the time stamping of the current and/or voltage measurement values at the two line ends (for example internal clocks of measuring devices), are chronologically synchronized with one another in the method according to the invention, so that the time stamps assigned at the two line ends can be compared with one another.

According to one advantageous embodiment of the method according to the invention, in order to identify a discrepancy between the estimated second current or voltage values and the measured second current or voltage values, the difference between the estimated second current or voltage values and the measured second current or voltage values is formed, and a discrepancy is identified when the magnitude of the difference exceeds a first threshold value, the first threshold value being selected as a function of the strength of the current flowing at the first line end.

In this way, a discrepancy between the estimated and measured second current or voltage values can be identified by simple mathematical operations, i.e. differencing and comparison with a threshold value. Because the threshold value is formed as a function of the strength of the current flowing at the second line end, the sensitivity in the identification of a discrepancy can be adapted to the respective operating situation, in particular the load situation of the line.

According to another advantageous embodiment of the method according to the invention, a mathematical model of the line for the fault-free case is employed in order to determine the estimated second current or voltage values.

In this way, with knowledge of line parameters of the fault-free line, for example a propagation constant relating to the propagation of traveling waves along the line and a characteristic impedance, determination of the current or voltage values at the other line end can be carried out by using a mathematical line volume valid for the propagation of traveling waves. For the fault-free case, the calculated values match with the values measured at the other line end.

Specifically, in this context, the first current and voltage values may be subjected to filtering in order to determine the estimated second current or voltage values, a transfer function dependent at least on the propagation constant of a traveling wave along the line being replicated by the filter.

In this way, with relatively low computation outlay, the desired estimated second current or voltage values can be determined through suitable filtering of the first current and voltage values by taking the propagation constant on the line into account. A digital FIR filter is preferably used as the filter (FIR=Finite Impulse Response).

Furthermore, in this context, a filter, with which a transfer function dependent on the characteristic impedance of the line is replicated, may additionally be used in the filtering of the first voltage values.

In this way, with relatively low computation outlay, the desired estimated second current or voltage values can be determined through suitable filtering of the first current and voltage values by taking the characteristic impedance of the line into account. A digital IIR filter is preferably used as the filter (IIR=Infinite Impulse Response).

According to one embodiment of the method according to the invention, the current and voltage values employed for determining the first fault position may be stored current and voltage values.

In this variant, so-called "offline fault location" with the aid of stored current and voltage values is carried out in order to be able to determine the fault position after the fault. Since more time is usually available for the location of a fault than for its identification and shutdown, the time delay occurring when using an offline method between the occurrence of the fault and the fault location normally does not constitute a problem.

As an alternative, however, the current and voltage values employed for determining the first fault position may directly each be instantaneously measured current and voltage values.

This method constitutes so-called "online fault location", in which the fault location is carried out immediately after identification of the current and voltage values relevant to the fault location and after positioning of the data window to be employed for the fault position determination. The fault position may therefore be determined more rapidly in this way than with the offline method.

According to another advantageous embodiment of the method according to the invention, a data window with an established length may be used.

In this embodiment, the length of the data window, i.e. the period of time, covered by the data window, of the time profiles to be evaluated, can be defined by simple parameter setting. The length is in this case to be selected in such a way that all traveling waves to be evaluated lie in the data window. According to experience, this is the case after a period of time which is given by the ratio of four times the line length and the wave speed (example for a line with a length of 100 km: t=4×100 km/0.98 c=1.4 ms; c=speed of light constant).

According to another alternative of the method according to the invention, a data window with a variable length may also be used, the end of the data window being established as a function of the time at which a deviation is no longer identified between the estimated second current or voltage values and the measured second current or voltage values.

According to this embodiment, identification of the duration of a fault status on the line can be carried out with the aid of the algorithm also used for positioning the data window. The end of the data window may then be established either at the instant of the end of the fault or at an instant which is somewhat later. In this embodiment, the length of the data window can therefore be adapted very flexibly to the actual duration of the fault status.

According to another advantageous embodiment of the method according to the invention, furthermore, with the current and voltage values measured at the second line end, estimated first current or voltage values may be calculated, which indicate the current flowing at the first line end or the voltage applied at the first line end. The estimated first current or voltage values may be compared with the current or voltage values measured at the first line end, and first and second current and voltage values that lie within a period of time established by a second data window may be employed in order to determine a first fault position. The start of the second data window is established as a function of the time at which a discrepancy is identified between the estimated first current or voltage values and the measured first current or voltage values.

In this embodiment, the fault location and the data window positioning required therefore may take place not only at one line end, but had both line ends in a corresponding way. All features, advantages and embodiments described above for the one-sided method may also be used or applied in a corresponding way to the two-sided method.

In the embodiment mentioned last, the fault position determination is, for example, carried out in a central device. It may, however, also be carried out in devices at the two line ends, specifically on the basis of the same measurement values but nevertheless independently of one another, as a result of which two results of the fault position determination are also produced (first and second fault positions). It is in this case possible that partially different algorithms are carried out in the devices for fault location. Reliability of the result may be deduced with the aid of the match of the results of the two line ends.

The fault position determined that the respective line end may, for example, be displayed directly on the device as a percentage of the line length or as a distance from the respective measurement site (for example in km or miles), or it may be output in the form of a signal or data telegram and transmitted to an operator of the power supply network. The devices at the two line ends may, for example, be protection apparatuses—usually provided in any case—for monitoring the line for faults.

In this context, specifically, the fault position of the fault occurring on the line may be determined by using the first fault position and the second fault position.

Although in the ideal case the first fault position matches with the second fault position, it may nevertheless occur in reality, for example because of measurement inaccuracies, transformer errors and other influences, that different results in the fault location are determined at the two ends. The definitive fault position may then either be indicated as alternatives ("fault lies at fault position 1 or fault position 2") or be determined by suitable combination of the first and second fault positions. If, for example, the fault position is indicated with a certain value margin (for example an error tolerance adapted to the measurement), the fault position to be used could be specified as that position (or region) at which the value ranges of the first and second fault positions overlap.

According to another alternative, the fault position of the fault occurring on the line may be determined by averaging from the first fault position and the second fault position.

The aforementioned object is also achieved by a device for determining the fault position of a fault on a line of an electrical power supply network. The device has a computing device, which is configured, by using first current and voltage values measured at a first line end of the line and time stamped, and second current and voltage values measured at a second line end of the line and time stamped, after the occurrence of a fault on the line, to determine the fault position of the latter.

According to the invention, the computing device is configured to determine, with the first current and voltage values measured at the first line end, to determine estimated current or voltage values which indicate the current flowing at the second line end or the voltage applied at the second line end. The computing device is furthermore configured to compare the estimated second current or voltage values with the second current or voltage values measured at the second line end, and the computing device is configured, in order to determine the first fault position, to use current and voltage values that lie within a period of time established by a first data window are employed in order to determine a first fault position. The start of the first data window is established as a function of the time at which a discrepancy is identified between the estimated second current or voltage values and the measured second current or voltage values.

In respect of the device according to the invention, all comments made above and below regarding the method according to the invention apply, and vice versa, in a corresponding way; in particular, the device according to the invention is configured for carrying out the method according to the invention in any desired embodiment or a combination of desired embodiments. In respect of the advantages of the device according to the invention, reference is also made to the advantages described regarding the method according to the invention.

Specifically, in respect of the device, the device may be an electrical protection apparatus or part of an electrical protection apparatus.

As an alternative, however, the device may be a data concentrator of switchgear of the electrical power supply network.

A data concentrator refers to a device which is arranged in the switchgear and collects data from one or more protective, measuring or controlling devices of the switchgear and/or another switchgear. The data concentrator may in this case be configured to subject the collected data, for example measurement values and/or status messages, to preprocessing and optionally data reduction, and forward them to a super ordinate device, for example a network control station. Furthermore, the data concentrator may also be configured to carry out certain evaluation, for example the fault location described above, with the collected data.

Lastly, the aforementioned object is also achieved by a system for determining the fault position of a fault on a line of an electrical power supply network. The system in this case comprises a device configured as claimed above.

According to the invention, a second device is provided, which contains a computing device. The computing device of the second device is configured to determine, with the current and voltage values measured at the second line end, estimated first current or voltage values which indicate the current flowing at the first line end or the voltage applied at the first line end. The computing device of the second device is configured to compare the estimated first current or voltage values with the first current or voltage values measured at the first line end. The computing device of the second device is configured, in order to determine a second fault position, to employ second current and voltage values that lie within a period of time established by a second data window are employed in order to determine a first fault position. The start of the second data window is established as a function of the time at which a discrepancy is identified between the estimated first current or voltage values and the measured first current or voltage values. The computing device of the first device and/or the computing device of the second device are determined to determine the fault position by using the first fault position and the second fault position.

In respect of the system according to the invention, all comments made above and below regarding the method according to the invention and the device according to the invention apply, and vice versa, in a corresponding way; in particular, the system according to the invention is configured for carrying out the method according to the invention in any desired embodiment or a combination of desired embodiments. In respect of the advantages of the device according to the invention, reference is also made to the advantages described regarding the method according to the invention and the device according to the invention.

The invention will be explained in more detail below with the aid of an exemplary embodiment. The specific configuration of the exemplary embodiment is to be understood as in no way restrictive for the general configuration of the method according to the invention and of the device according to the invention; rather, individual configuration features of the exemplary embodiment may be freely combined in any desired way with one another and with the features described above.

Other features which are considered as characteristic for the invention are set forth in the appended claims.

Although the invention is illustrated and described herein as embodied in a method, device and system for determining the fault position of a fault on a line of an electrical power supply network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
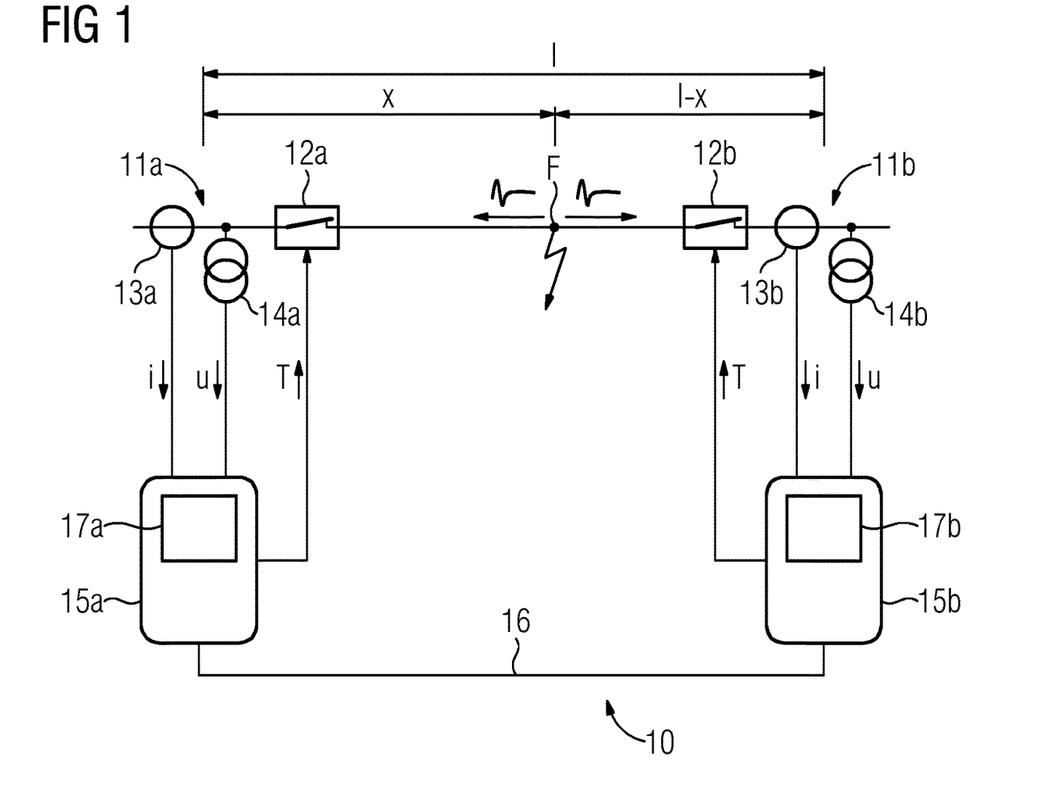
FIG. 1 is a schematic view of a line of a power supply network with a first exemplary embodiment of a system for determining default position according to the invention.

Referring now to the figures of the drawings in detail and first, particularly to FIG. 1 thereof, there is shown a schematic view of a system 10 for determining a fault position in an electrical power supply network. To this end, an electrical line 11 of the power of flight network is shown in a simplified representation in FIG. 1. Let the line have the length l. The line 11 may be a single-phase or polyphase line.

The line 11 is terminated at its line ends 11a and 11b by power switches 12a, 12b, and may be separated by these, particularly in the event of a fault, from the rest of the power supply network (not represented in detail in FIG. 1). Measurement sites, at which current and voltage measurement values can be recorded by current transformers 13a, 13b and voltage transformers 14a, 14b (merely represented by way of example in FIG. 1), are furthermore provided at the line ends 11a and 11b. The current transformers 13a, 13b and the voltage transformers 14a, 14b may be so-called conventional or nonconventional transformers. On the secondary side, current measurement values i and voltage measurement values u, which may be analog or digitized values, are delivered by the transformers.

Connected to the current transformers 13a, 13b and the voltage transformers 14a, 14b, there are devices 15a, 15b at the respective line ends 11a and 11b for determining a fault position. The devices 15a, 15b record the current and voltage measurement values and optionally carry out digitizing and/or preprocessing. In this case, a time stamp, which accurately indicates the time of the recording, is also assigned to the respective measurement values. To this end, the devices 15a, 15b comprise internal time as, which are chronologically synchronized with one another by means of conventional methods, for example GPS time pulses, IRIG-B, IEEE 1588. Because of the time stamping, the measurement values recorded at the two line ends 11a and 11b can be compared with one another.

The devices 15a, 15b may, for example, the electrical protection apparatuses which, besides a fault location function, also carry out further protect and monitoring functions. For example, the protection apparatuses may be distance protection apparatuses, differential protection apparatuses or over current protection apparatuses, which monitor the operating status of the line 11 with the aid of the recorded current and voltage measurement values and, in the event of a fault, transmit a shutdown signal T to their respective power switch 12a, 12b, in order to make the latter open its protective contacts.

The devices 15a, 15b each comprise a computing device 17a, 17b, which is respectively configured, in the event of a fault on the line 11, to determine the fault position, i.e. the position on the line at which a fault (for example short circuit, ground fault) has occurred. To this end, the current and voltage measurement values of the line end in question and of the respective other line end, which have been recorded during the fault, are used. To this end, the devices 15a, 15b are connected by a communication connection 16, which may be any desired suitable wired or wireless communication connection. Via the communication connection 16, the devices 15a, 15b can inter alia exchange their current and voltage measurement values in order to determine the fault position.

The devices 15a, 15b carry out fault location according to the so-called traveling wave principle. In this case, use is made of the fact that, when a fault occurs, high-frequency transient signal components, which propagate along the line 11 in both directions approximately at the speed of light, occur in the current and in the voltage. This is indicated in FIG. 1 by way of example to this end, it is assumed that a fault has occurred at a fault position F. The traveling waves propagate as represented from the fault position F both in the direction of the first line end 11a and in the direction of the second line end 11b, and can be recorded by measurement there and evaluated with the devices 15a, 15b for fault position determination. As seen from the first line end, the fault position F is situated at a distance x, and correspondingly the fault position F is situated at a distance l-x as seen from the second line end. The devices evaluate the current and voltage measurement values as described in detail below, and indicate the fault position F, for example as a distance or percentage of the line length l.

The operator of the power supply network may forward the fault position F which has been determined to a maintenance team, who may then go to the fault position and remedy the causes of the fault. To this end, maximally accurate determination of the fault position is necessary.

Figure 2:
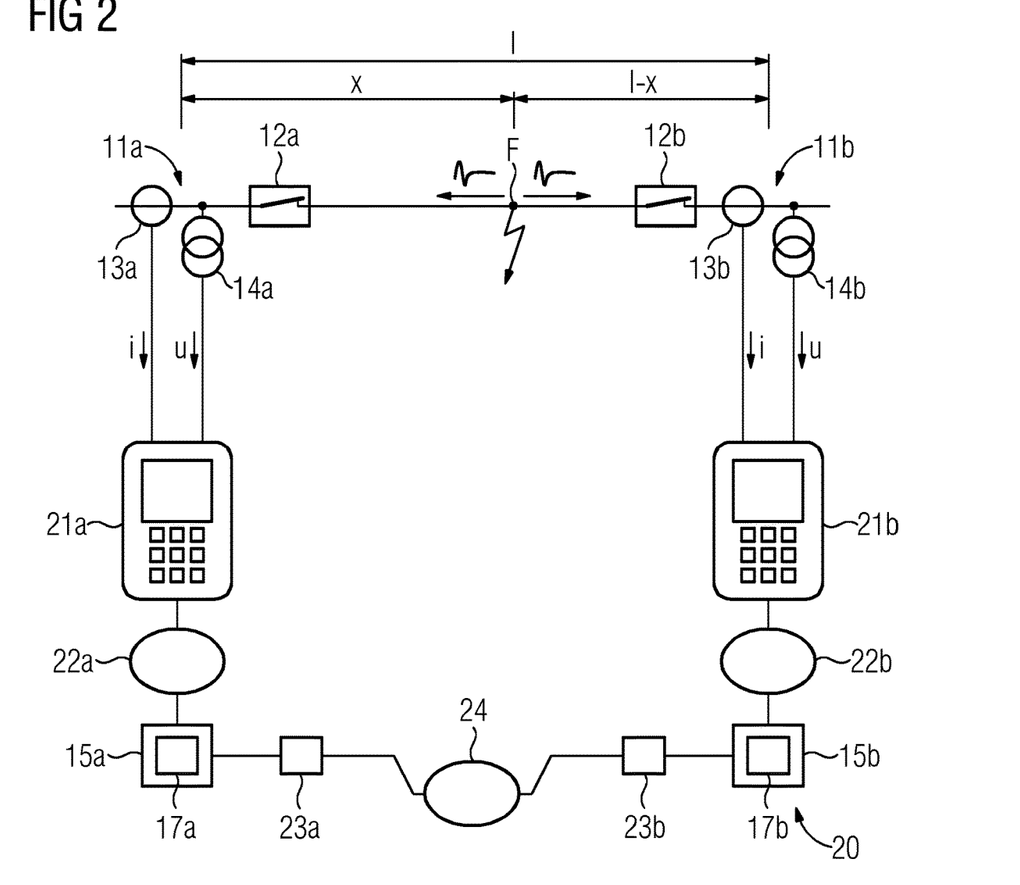
FIG. 2 is a schematic view of the line of the power supply network with a second exemplary embodiment of the system for determining default position.

In another exemplary embodiment of a system 20 fault location, which is schematically shown in FIG. 2, the devices 15a, 15b may also be data concentrators. In the exemplary embodiment according to FIG. 2 measurement values of current and voltage are recorded via corresponding transformers 13a, 13b, 14a, 14b by means of measuring apparatuses 21a, 21b as described with reference to FIG. 1. The measuring apparatuses 21a, 21b may, for example, be protection apparatuses of the type described with reference to FIG. 1. In another case, the measuring apparatuses 21a, 21b may be so-called fault recorders, which under event control or continuously record and store measurement values with a high sampling rate.

For example, the measuring apparatuses 21a, 21b may under event control record fault records, i.e. a chronological sequence of current and voltage values during a presumed fault status. Because of the possible transfer function of the trigger methods used for this, a recorded fault record need not necessarily contain a fault on the line 11 to be monitored. A recorded fault record is transmitted after recording to the data concentrator 15a, 15b situated in the local network 22a, 22b of the respective switchgear.

The data concentrators 15a, 15b of the switchgears of the two line ends are, for example, connected by communication apparatuses 23a, 23b (for example routers), to a wide area network 24 (WAN). The respective data concentrator 15a, 15b transmits the fault record received from the measuring apparatus 21a, 21b via the wide area network 24 to the data concentrator 15b, 15a at the respective other line end. As a result, the fault records of both line ends are present in the data concentrators 15a, 15b. These fault records are then employed for carrying out fault location.

While the system 10 according to FIG. 1 is suitable both for online fault location on the basis of directly recorded measurement values and for offline fault location on the basis of stored measurement values, the system 20 of FIG. 2 is more suitable for offline fault location, since a plurality of storage and transmission steps are carried out. With correspondingly faster transmission and data evaluation, however, the system 20 may also be employed for online fault location, in which immediately after the fault the position of the latter is also displayed.

A procedure for accurate fault location is described below. First, a brief explanation of the principle of traveling wave fault location will be given. To this end, a two-sided traveling wave fault location algorithm will be explained below, i.e. an algorithm which operates with measurement values of both line ends 11a, 11b. A propagation model for traveling waves along the line 11 is used in this case.

In order to set up the algorithm in question, the "theory of long lines" is used. This is the model representation of an electrical line in the form of so-called "distributed parameters". This is represented by way of example in FIG. 3.

Figure 3:
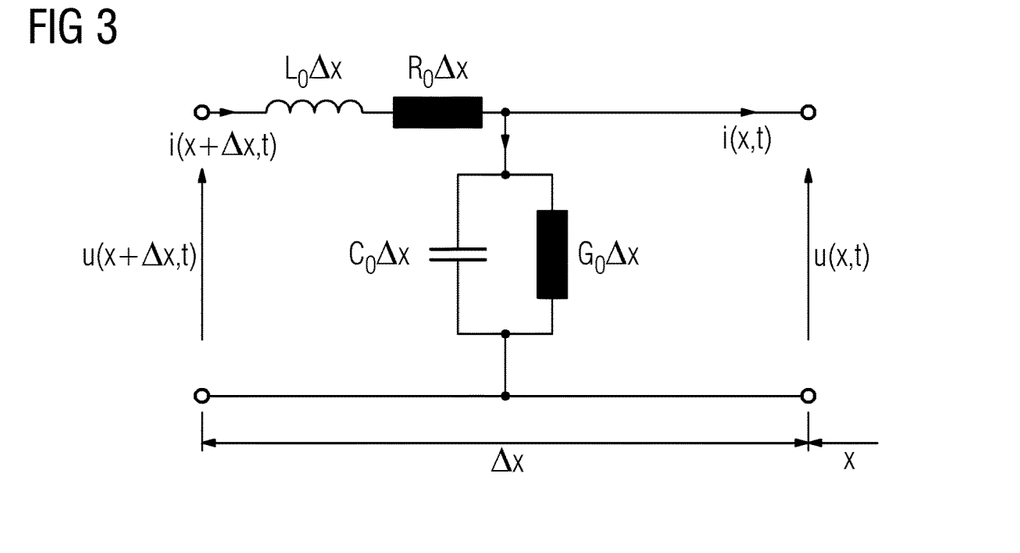
FIG. 3 is a circuit representation of electrical parameters of a line section Δx to explain the determination of a fault position according to the traveling wave principle.

In FIG. 3, it can be seen the network parameters such as inductance per unit length $L_0$, capacitance per unit length $C_0$, resistance per unit length $R_0$ and conductance per unit length $G_0$ are distributed along the line. On the basis of the line model, by using Kirchhoff's laws for the segment $\Delta x$ of the line, the following equations can be set up for the u and the current i:

$$u(x+\Delta x, t) = R_0 \Delta x \cdot i(x+\Delta x, t) + L_0 \Delta x \frac{\partial i(x+\Delta x, t)}{\partial t} + u(x, t) \quad (1)$$

$$i(x+\Delta x, t) = G_0 \Delta x \cdot u(x, t) + C_0 \Delta x \frac{\partial u(x, t)}{\partial t} + i(x, t) \quad (2)$$

By mathematical rearrangement, Equations (1) and (2) can be converted into the following form:

$$a) \quad \frac{\partial u(x, t)}{\partial x} = R_0 \cdot i(x, t) + L_0 \frac{\partial i(x, t)}{\partial t} \quad (3)$$

$$b) \quad \frac{\partial i(x, t)}{\partial x} = G_0 \cdot u(x, t) + C_0 \frac{\partial u(x, t)}{\partial t} \quad (4)$$

These Equations (3) and (4) our partial differential equations of a homogeneous line, and are conventionally referred to as "telegrapher's equations". They may be generalized to arbitrary numbers of conductors.

By considering Equations (3) and (4) in Laplace space with the assumption of x as a parameter, many effects occurring in the line can be interpreted much more simply:

$$\frac{\partial u(x, s)}{\partial x} = R_0 \cdot i(x, s) + sL_0 \cdot i(x, s) \quad (5)$$

-continued $$\frac{\partial i(x, s)}{\partial x} = G_0 \cdot u(x, s) + sC_0 \cdot u(x, s) \quad (6)$$

The derivative of Equations (5) and (6) with respect to the parameter x gives:

$$\frac{\partial^2 u(x, s)}{\partial x^2} = Z(s)Y(s) \cdot u(x, s) \quad (7)$$

$$\frac{\partial^2 i(x, s)}{\partial x^2} = Y(s)Z(s) \cdot i(x, s) \quad (8)$$

Equations (7) and (8) may be solved separately for voltage and current by using differential equation theory:

$$U(x) = e^{-\gamma(s)x} \cdot A_1 + e^{\gamma(s)x} \cdot A_2 \quad (9)$$

$$Z_c(s) \cdot I(x) = e^{-\gamma(s)x} \cdot A_1 - e^{\gamma(s)x} \cdot A_2 \quad (10)$$

When solving Equations (9) and (10), it is possible to calculate the unknown parameters $A_1$ and $A_2$ from the initial conditions:

$$A_1 = \frac{1}{2}(U_1(s) + Z_c(s) \cdot I_1(s)) \quad (11)$$

$$A_2 = \frac{1}{2}(U_1(s) - Z_c(s) \cdot I_1(s)) \quad (12)$$

where $U_1$ and $I_1$ represent the initial conditions at x=0.

Furthermore, Equations (9) and (10) contain a so-called characteristic impedance $Z_C$ and the propagation constant $\gamma$, and these may be calculated from the line parameters:

$$\gamma(s)^2 = Z(s)Y(s) \quad (13)$$

$$Z_c(s) = \gamma(s)^{-1} \cdot Z(s) \quad (14)$$

Here, Z stands for the series impedance and Y for the shunt admittance of a section of the line. The values are respectively indicated per unit length.

The following forms are therefore obtained for Equations (9) and (10):

$$U(x,s) = \frac{1}{2}e^{-\gamma(s)x} \cdot (U_1(s) + Z_c(s) \cdot I_1(s)) + \frac{1}{2}e^{\gamma(s)x} \cdot (U_1(s) - Z_c(s) \cdot I_1(s)) \quad (15)$$

$$Z_c(s) \cdot I(x,s) = \frac{1}{2}e^{-\gamma(s)x} \cdot (U_1(s) + Z_c(s) \cdot I_1(s)) - \frac{1}{2}e^{\gamma(s)x} \cdot (U_1(s) - Z_c(s) \cdot I_1(s)) \quad (16)$$

Equations (15) and (16) represent a voltage—and respectively current-related propagation model for traveling waves along the line 11, which may be used for fault location according to the traveling wave method.

Figure 4:
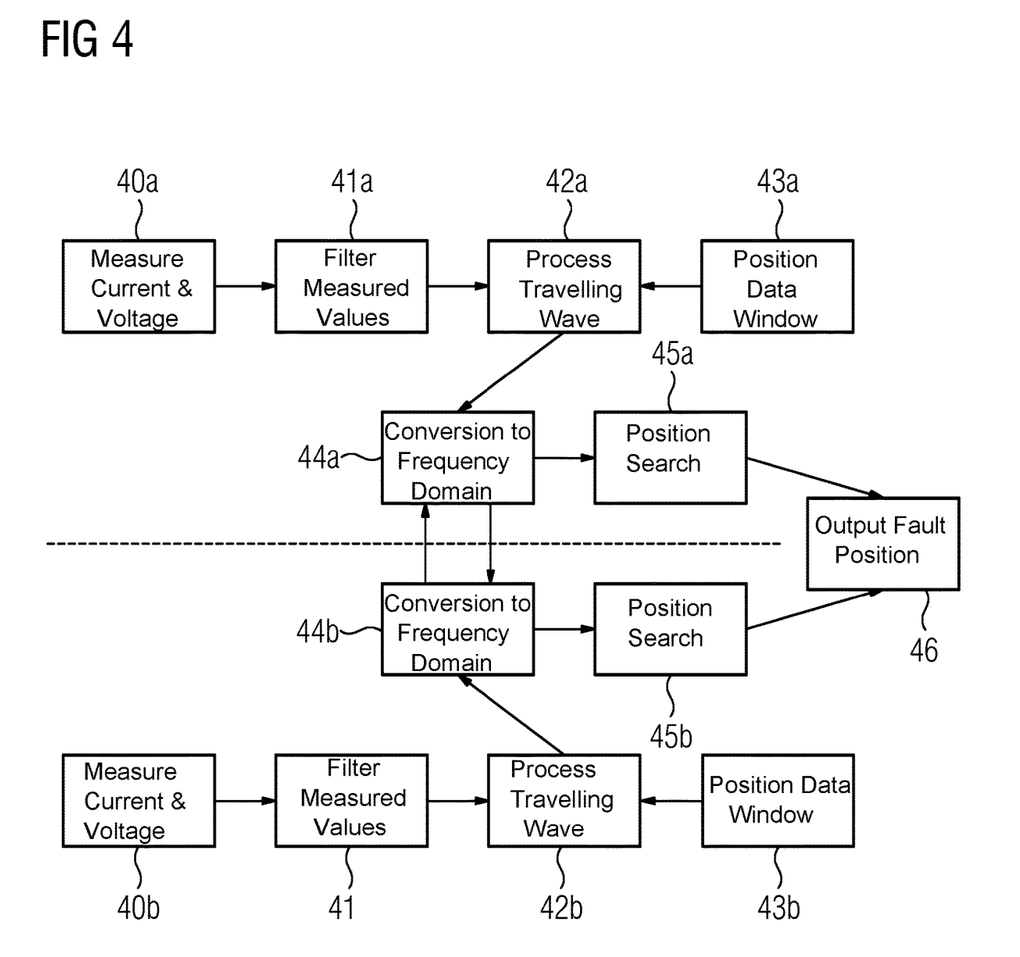
FIG. 4 is a flow chart for explaining one exemplary embodiment of a method for fault location.

One possible example of the procedure for fault location according to the traveling wave principle will be explained with the aid of FIG. 4. To this end, FIG. 4 shows a schematic flow chart of one exemplary of a method for determining a false position. In this case, the method steps above the dashed line take place in the device 15a at the first line end 11a, and those below the dashed line take place in the device 15b at the second line end 11b (see FIGS. 1 and 2).

Figure 5:
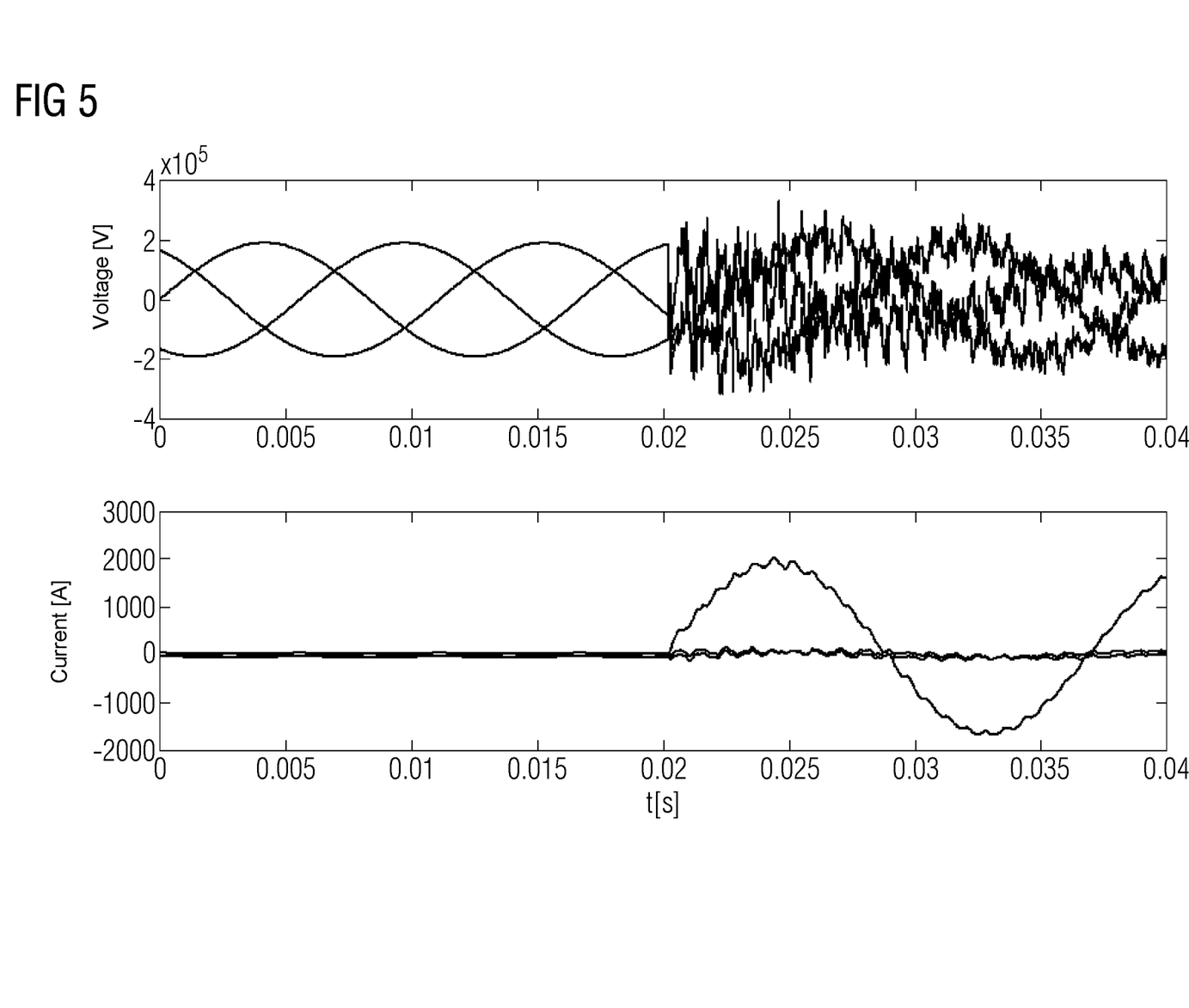
FIG. 5 is a graph showing exemplary profiles of current and voltage values during a fault on a line.

In steps 40a and 40b, the local currents and voltages at the two line ends are respectively measured first and corresponding current and voltage measurement values are generated. These measurement values are in the form of sampled values of the current and voltage signals of the line 11. An example of the recorded current and voltage measurement values can be seen in FIG. 5; a fault occurrence at about t=0.02 s can be seen.

So that only the high-frequency transient components (traveling waves) of the respective current/voltage measurement values are recorded, filtering (for example by a band pass filter) may respectively take place optionally in steps 41a and 41b. Through the selection of the cutoff frequencies, for example of the band pass filter, the method can be adapted to the properties of the transformers 13a, 13b and 14a, 14b. If these transformers provide only a medium bandwidth, for example only up to 10 kHz, then the filters need to limit the bandwidth of the signals to the bandwidth of the transformers. Depending on the phase error of the transformers used, a somewhat lower measurement accuracy is then to be expected. If the transducers provide a higher bandwidth, for example up to 500 kHz, the filters should be dimensioned accordingly. Furthermore, it is found advantageous for the filter characteristic of the filter used for filtering the current/voltage measurement values to attenuate those frequency components in which the measuring transformers 13 and 14, respectively, have measurement errors.

Figure 6:
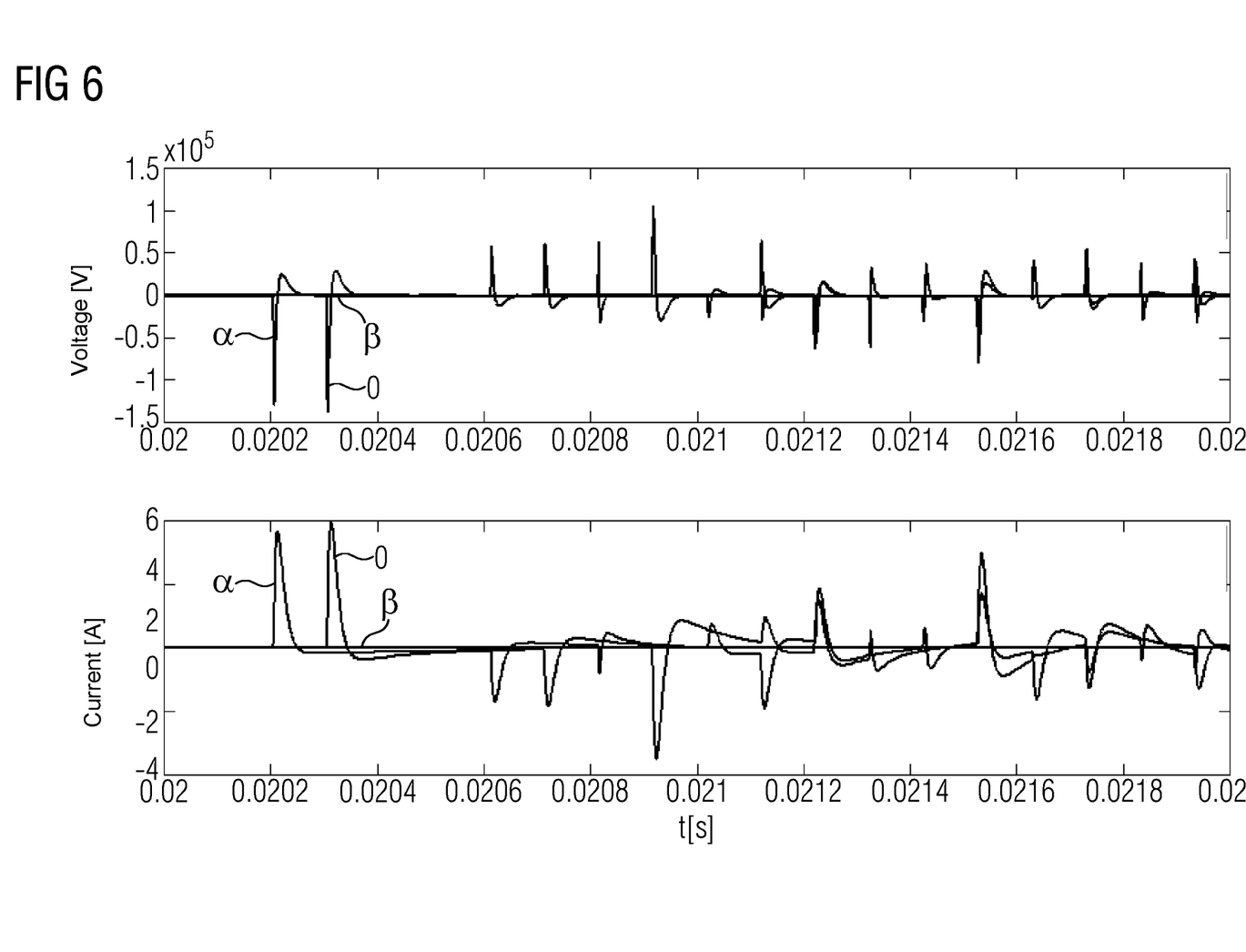
FIG. 6 is a graph showing exemplary profiles of transformed current and voltage values during a fault on a line.

In the case of three-phase power supply networks, the respective traveling waves may optionally furthermore respectively be processed by a transformation (for example a Clarke transformation) in steps 42a and 42b, in order to decouple the phase-related components. In this case, transformed filtered current and voltage values are generated, such as are shown by way of example in FIG. 6.

In order to start the obligation method only when required, i.e. in the event of a fault, the positioning of a data window, with which those current and voltage measurement values which are intended to be employed for the fault location are selected, is carried out in steps 43a and 43b. Correct positioning of the data window is essential for accurate fault location. The specific procedure for the data window positioning will be explained below in connection with FIG. 7. The profiles shown in FIG. 6 have already been reduced to the data window determined in steps 43a and 43b.

If the subsequent evaluation is intended to take place in the frequency domain, conversion of the transformed current and voltage values into the frequency domain takes place in steps 44a and 44b. This is preferably done by a fast Fourier transform (FFT) or discrete Fourier transform (DFT).

As indicated by the arrows between the blocks of steps 44a and 44b, the resulting values are exchanged between the devices 15a and 15b (see FIGS. 1 and 2). This is done via the communication connection 16 or the wide area network 24.

With their own values and the values of the respective other line end, the devices 15a and 15b then carry out a position search according to the traveling wave principle in steps 45a and 45b if an evaluation is carried out in the time domain, then instead of this the data in the time domain may be exchanged and evaluated. The fault position x is finally obtained from the evaluation.

In step 46, the fault position which has been determined is then output. According to FIG. 4, takes place in a common output step. Instead of this, separate output may also be carried out by each of the two devices 15a and 15b, respectively. In this case, each of the devices 15a and 15b, respectively, may output its own position, or a (definitive) fault position may be determined by suitable combination of the fault positions respectively determined by the devices 15a and 15b.

The devices 15a and 15b conventionally have a computing device, in which steps 40a/b to 46 are carried out. This may, for example, be a microprocessor which accesses corresponding equipment software that is contained in a memory of the respective device. As an alternative, it may also be a computation unit with programming determined by hard work, for example an ASIC or FPGA.

A procedure with which the data window required for the evaluation of the current and voltage values can be positioned as accurately as possible will be explained below. This positioning is a prerequisite for maximally accurate fault location.

By rearranging Equations (15) and (16), the total line length l being selected as a reference point for the start of the line and for the parameter x (distance x from the reference point), the following Set of Equations (17) obtained:

$$\begin{pmatrix} U_2(s) \\ I_2(s) \end{pmatrix} = \begin{pmatrix} \cosh(\gamma(s) \cdot l) & Z_c(s) \cdot \sinh(\gamma(s) \cdot l) \\ \frac{1}{Z_c(s)} \cdot \sinh(\gamma(s) \cdot l) & \cosh(\gamma(s) \cdot l) \end{pmatrix} \begin{pmatrix} U_1(s) \\ I_1(s) \end{pmatrix} \quad (17)$$

This Set of Equations (17) describes in the frequency domain the way in which the signals $U_2$ and $I_2$ of the second line end can be calculated from the signals $U_1$ and $I_1$ of the first line end.

In order to be able to determine the signals from the winces of sampled values, a transformation of the equations into the z domain may be carried out. This is shown by way of example with reference to the prediction equation for determining the estimated $I_{f2}(s)$ at the second line end from the current and voltage signals $I_1(s)$ and $U_1(s)$ of the first line end:

$$I_{f2}(z) = Y_c(z) * G_1(z) * U_1(z) + G_2(z) * I_1(z) \quad (18)$$

The transfer functions used in Equation (18) are in this case defined as follows:

$$G_1(z) = F^{-1}\{\sinh(\gamma(s) \cdot l)\} \quad (19)$$

$$G_2(z) = F^{-1}\{\cosh(\gamma(s) \cdot l)\} \quad (20)$$

$$Y_c(z) = F^{-1}\left\{\frac{1}{Z_c(z)}\right\} \quad (21)$$

Figure 7:
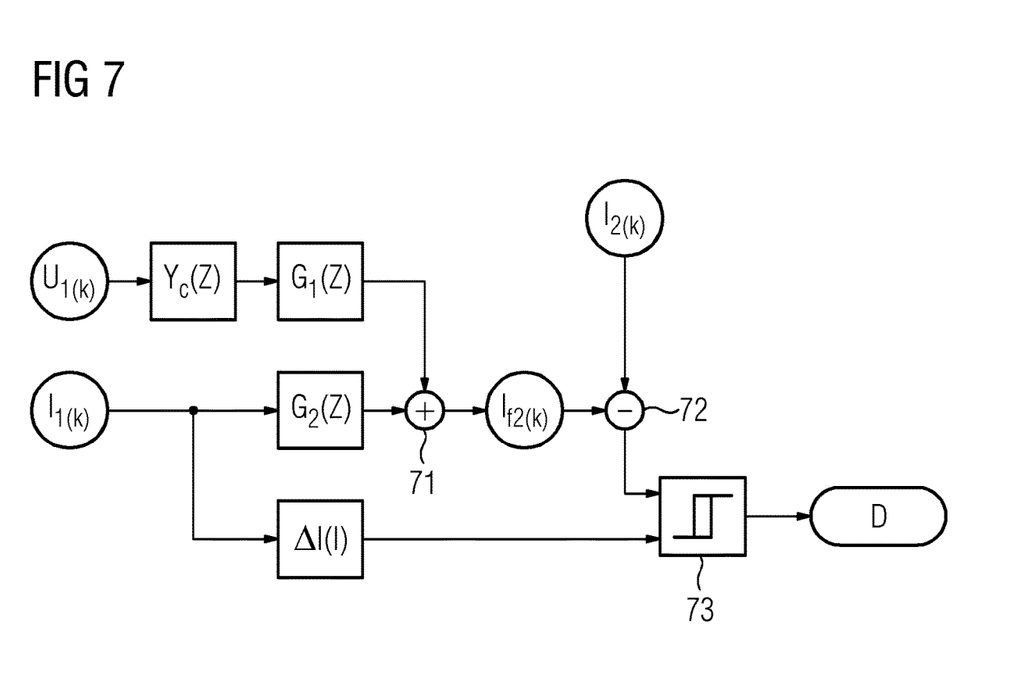
FIG. 7 is a block diagram for explaining a positioning of a data window.

Advantageously, the transfer functions $G_1(z)$ and $G_2(z)$ taking into account the propagation constant γ are imaged by an FIR filter, and the transfer function $Y_c(z)$ taking into account the characteristic impedance $Z_c$ are imaged by an IIR filter. The estimated current of the second end of the line can therefore be determined from the current and voltage signals of the first line end with the aid of a logical arrangement as represented in FIG. 7. The logical arrangement according to FIG. 7 may in this case be implemented in the form of hardware or software run by a processor in the device 15a. The estimated current $I_{f2}$ of the second line then is formed from the current and voltage values $I_1$ and $U_1$ measured at the first line end by applying the transfer functions $G_1(z)$ and $G_2(z)$ as well as $Y_c(z)$ (for example by filtering) and addition in an adder 71.

The estimated second current values $I_{f2}$ are then compared by differencing in a subtractor 72 with the current values $I_2$ actually measured at the second line end. Comparison of the resulting difference with a threshold value takes place in a threshold value element 73. If the threshold value is exceeded, a signal D which indicates a fault on the line is formed. This signal D defines the data window to be used for fault location, by establishing that instant at which the signal D occurs for the first time as the start of the data window.

The length of the data window may be rigidly predetermined, or determined variably. In the case of a fixed specification, the length of the data window should preferably be at least four times the propagation time of the traveling wave in the selected modal, so that all wave phenomena required for the fault location are taken into account in the data window. In the case of variable determination, the length of the data window may be coupled to the existence of the signal D (and therefore the duration of the fault on the line).

The threshold value used in the threshold value element may, for example, be adapted to the strength of the current $I_1$ at the first line end. To this end, the block $\Delta I(I)$ in FIG. 7 forms, for an instantaneous ($k^{th}$) sampled current value $I_k$, a threshold value $I_s(k)$ which is used for the threshold value comparison in the threshold value element 73. This stabilization value may, for example, be formed by means of the following Equation (22):

$$I_s(k) = 0.08 \cdot \frac{1}{N} \sqrt{\sum_{i=0}^{N} i^2(k-i)} + 0.02 \quad (22)$$

Figure 8:
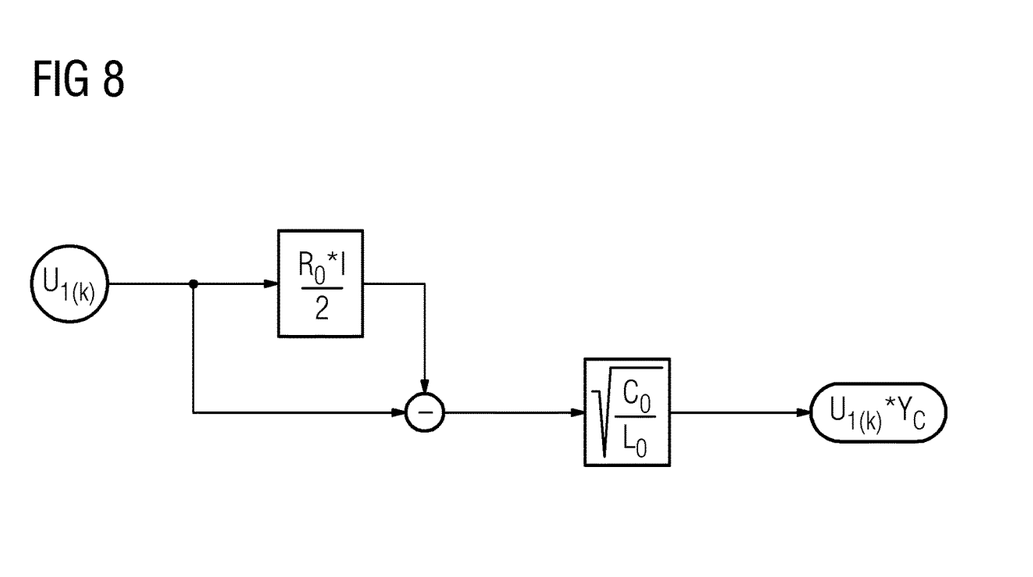
FIG. 8 is a block diagram for an exemplary explanation of the filtering of voltage values.

The transfer functions $Y_c(z)$ may, for example, be calculated by a least-squares estimator from the frequency excursion of the characteristic impedance $Z_c$. If modelling of the frequency dependency of the parameters inductance per unit length $L_0$, capacitance per unit length $C_0$, resistance per unit length $R_0$ and conductance per unit length $G_0$ can be omitted, and the admittance value of conductance per unit length $G_0$ can be assumed to be very small (this is usually the case for frequencies below 50 kHz and overhead lines), then the convolution product, required for the logical arrangement in FIG. 7, of $Y_c$ with the local voltage of the line may also be formed with a logical arrangement such as is represented in FIG. 8.

The transfer functions $G_1$ and $G_2$ may furthermore be formed by inverse FFT from the terms of the hyperbolic functions with the argument $\gamma \cdot l$.

Figure 9:
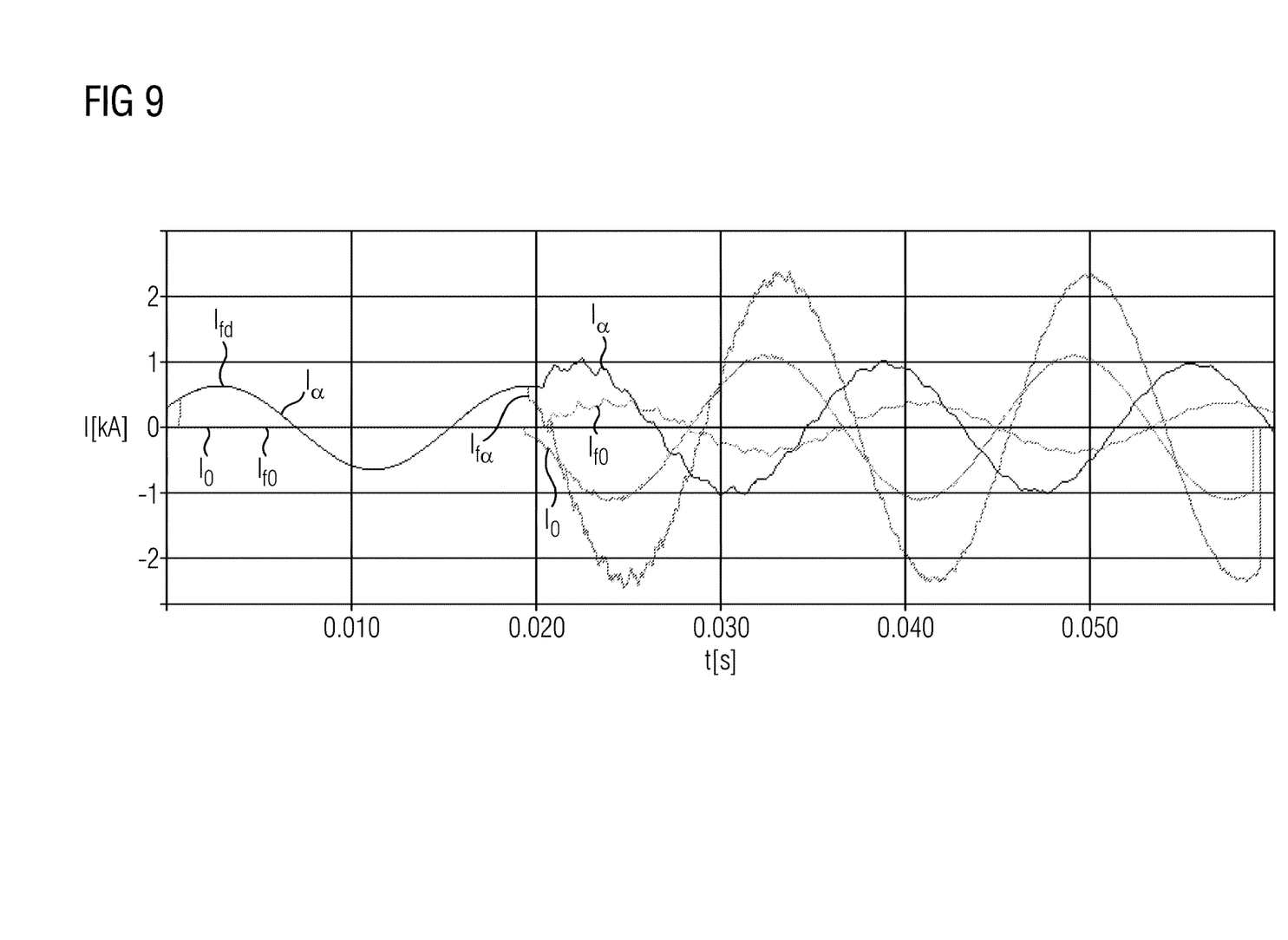
FIG. 9 is a graph showing an exemplary diagram with the profiles of estimated second current values and measured second current values.

FIG. 9 shows the estimated current calculated by means of the current and voltage values at the first line end, and the current signal actually measured at the second line end. In that, for the period of time in which the line is fault-free, the estimated (calculated) and measured second current values match fully, while a significant deviation can be seen when a fault occurs. This behavior is used as described for positioning the data window.

Corresponding logic is implemented in the device 15b in order to determine the current at the first line end and establish the data window for the fault location in a corresponding way, so that the comments described in respect of the first line end also apply correspondingly for the second line end.

Figure 10:
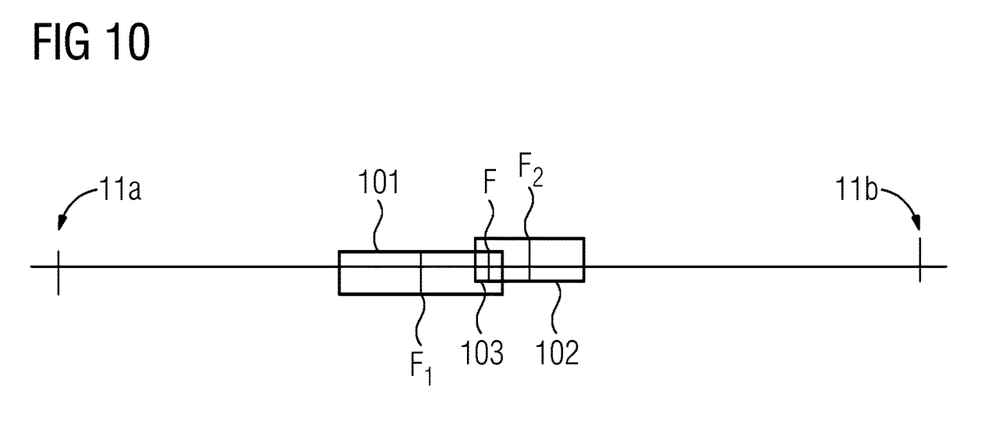
FIG. 10 is an illustration of a first example of the determination of a fault position from a first and a second fault position.

FIG. 10 shows a possible way in which a definitive fault position F can be determined from a first fault position $F_1$, determined at the first line end 11a with the device 15a, and a second fault position $F_2$ determined at the second line end 11b with the second device 15b.

According to the exemplary embodiment of FIG. 10, both the first fault position and the second fault position are indicated not as a singular point but as a range. This may for example be done by assigning a tolerance range to the calculated fault position, which for example takes into account possible errors in the measurement and/or data processing. Thus, according to FIG. 10, a value range 101 is assigned to the first fault position $F_1$, while a value range 102 is assigned to the second fault position $F_2$. The value ranges 101 and 102 may in this case have identical values or values differing from one another. The definitive fault position F is established in the middle of the overlap range 103 of the two value ranges 101 and 102.

Figure 11:
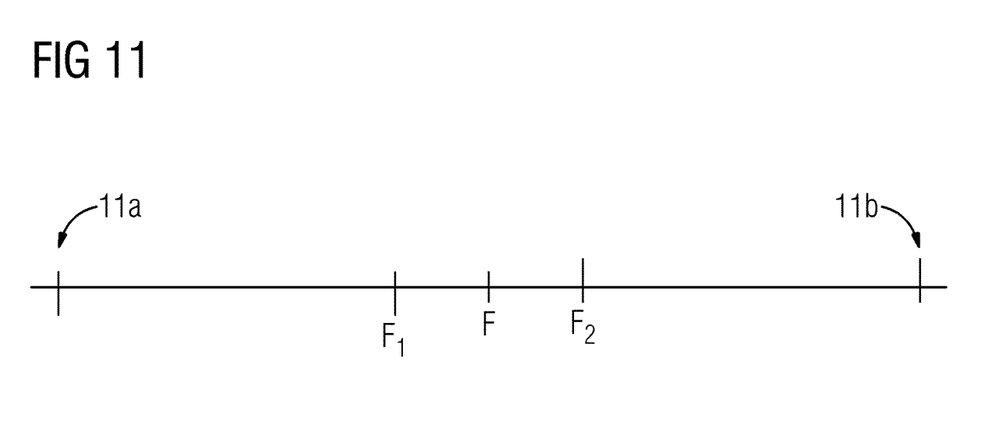
FIG. 11 is an illustration of a second example of the determination of a fault position from a first and a second fault position.

Lastly, FIG. 11 shows an alternative procedure for establishing the definitive fault position F from the first fault position $F_1$ and the second fault position $F_2$. According to FIG. 11, the fault position F is formed by averaging from the first fault position $F_1$ and the second fault position $F_2$.

A procedure by which a data window can be positioned with high accuracy, in order to ensure maximally exact location according to the traveling wave principle, has therefore been described above in this case, trigger signals of a protective function are not employed for the data window determination, as is usual in the prior art, but instead, from the current and voltage values of one line end, estimated current values at the other line end are determined, for example by using a line model of the line not affected by a fault. For the case in which the line does not have a fault, these estimated current values match with the measured current values at the second line end. The period of time in which the signals differ therefore corresponds to the period of time in which the line is affected by a fault.

The method may be used in conjunction with a device for two-sided traveling wave fault location.

Although the procedure for the data window positioning has been described above with reference to estimated current values at the other line end, the method may also be carried out in a corresponding way by determining estimated voltage values and comparison with the corresponding measured voltage values.

A system for determining a fault position, in which the fault position is determined by two devices 15a and 15b, each of which lies at a line end 11a or 11b, respectively, has been shown in FIGS. 1 and 2. Instead of this, it is also possible to provide a central device, to which the current and voltage measurement values of the line ends are delivered.

Although the invention has been illustrated and described in detail with the aid of preferred exemplary embodiments, the invention is not restricted to the examples disclosed, and other variants may be derived therefrom by the person skilled in the art without departing from the protective scope of the invention.

The invention claimed is:

1. A method for determining a fault position of a fault on a line of an electrical power supply network, which comprises the steps of:
    measuring first current and voltage values at a first line end of the line and providing the first current and voltage values with a time stamp;
    measuring second current and voltage values at a second line end of the line after the first current and voltage values are measured at the first line end, providing the second current and voltage values with a time stamp, the second current and voltage values indicating a current flowing at the second line end or a voltage applied at the second line end;
    determining the fault position of the line using time-stamped first and second current and voltage values after an occurrence of the fault on the line by the further steps of:
        determining from the first current and voltage values measured at the first line end, estimated second current or voltage values which indicate a current flowing at the second line end or a voltage applied at the second line end;

comparing the estimated second current or voltage values with the second current or voltage values measured at the second line end; and employing the first and second current and voltage values that lie within a period of time established by a first data window in order to determine a first fault position, a start of the first data window being established in dependence on a time at which a discrepancy is identified between the estimated second current or voltage values and the second current or voltage values measured.

2. The method according to claim 1, which further comprises:

determining a difference between the estimated second current or voltage values and the second current or voltage values measured to identify the discrepancy between the estimated second current or voltage values and the second current or voltage values measured; and identifying the discrepancy when a magnitude of the difference exceeds a first threshold value, the first threshold value being selected in dependence on a strength of a current flowing at the first line end.

3. The method according to claim 1, which further comprises employing a mathematical model of the line for a fault-free case in order to determine the estimated second current or voltage values.

4. The method according to claim 3, which further comprises subjecting the first current and voltage values to filtering in a filter in order to determine the estimated second current or voltage values, a transfer function dependent at least on a propagation constant of a traveling wave along the line being replicated by the filter.

5. The method according to claim 4, which further comprises using the filter, with which a transfer function dependent on a characteristic impedance of the line is replicated, for filtering the first voltage values.

6. The method according to claim 1, wherein the first and second current and voltage values employed for determining the first fault position are stored current and voltage values.

7. The method according to claim 1, wherein the first and second current and voltage values employed for determining the first fault position are directly each instantaneously measured current and voltage values.

8. The method according to claim 1, which further comprises using a data window with an established length as the first data window.

9. The method according to claim 1, which further comprises using a data window with a variable length as the first data window, an end of the first data window being established in dependence on a time at which a deviation is no longer identified between the estimated second current or voltage values and the second current or voltage values measured.

10. The method according to claim 1, which further comprises:

after the second current and voltage values are measured at the second line end, calculating estimated first current or voltage values, which indicate a current flowing at the first line end or a voltage applied at the first line end;

comparing the estimated first current or voltage values with the first current or voltage values measured at the first line end; and employing the first and second current and voltage values that lie within a period of time established by a second data window in order to determine the first fault position, a start of the second data window being established in dependence on a time at which a discrepancy is identified between the estimated first current or voltage values and the first current or voltage values measured.

11. The method according to claim 10, which further comprises determining the fault position of the fault occurring on the line by using the first fault position and a second fault position.

12. The method according to claim 11, which further comprises determining the fault position of the fault occurring on the line by averaging from the first fault position and the second fault position.

13. A device for determining a fault position of a fault on a line of an electrical power supply network, the device comprising:

a computing device configured to receive and use first current and voltage values measured at a first line end of the line and time stamped, and second current and voltage values measured at a second line end and time stamped, after an occurrence of the fault on the line, to determine the fault position of the line;

said computing device configured to determine, with the first current and voltage values measured at the first line end, estimated second current or voltage values which indicate a current flowing at the second line end or a voltage applied at the second line end;

said computing device configured to compare the estimated second current or voltage values with the second current or voltage values measured at the second line end; and said computing device configured, in order to determine a first fault position, to use the first and/or second current and voltage values that lie within a period of time established by a first data window and are employed in order to determine the first fault position, a start of the first data window being established in dependence on a time at which a discrepancy is identified between the estimated second current or voltage values and the second current or voltage values measured.

14. The device according to claim 13, wherein the device is an electrical protection apparatus or part of an electrical protection apparatus.

15. The device according to claim 13, wherein the device is a data concentrator of switchgear of the electrical power supply network.

16. A system for determining a fault position of a fault on a line of an electrical power supply network, comprising:

a device according to claim 13;

a second device having a second computing device, wherein:

said second computing device configured to determine, with the second current and voltage values measured at the second line end, estimated first current or voltage values which indicate a current flowing at the first line end or a voltage applied at the first line end;

said second computing device configured to compare the estimated first current or voltage values with the first current or voltage values measured at the first line end;

said second computing device configured, in order to determine a second fault position, to employ the second current and voltage values that lie within a period of time established by a second data window are employed in order to determine a first fault position, a start of the second data window being established in dependence on a time at which a discrepancy is identified between the estimated first current or voltage values and the first current or voltage values measured; and said computing device of said first device and/or said second computing device of said second device are used determined to determine the fault position by using the first fault position and the second fault position.

\* \* \* \* \*